United States Patent
Imanishi et al.

(10) Patent No.: US 11,795,282 B2
(45) Date of Patent: Oct. 24, 2023

(54) POLYPROPYLENE FILM, METAL FILM LAMINATED FILM USING SAME, AND FILM CAPACITOR

(71) Applicant: Toray Industries, Inc., Tokyo (JP)

(72) Inventors: Yasuyuki Imanishi, Otsu (JP); Masatoshi Ohkura, Otsu (JP); Yuta Nakanishi, Otsu (JP)

(73) Assignee: Toray Industries, Inc., Tokyo (JP)

( * ) Notice: Subject to any disclaimer, the term of this patent is extended or adjusted under 35 U.S.C. 154(b) by 502 days.

(21) Appl. No.: 17/268,650

(22) PCT Filed: Aug. 20, 2019

(86) PCT No.: PCT/JP2019/032413
§ 371 (c)(1),
(2) Date: Feb. 16, 2021

(87) PCT Pub. No.: WO2020/040127
PCT Pub. Date: Feb. 27, 2020

(65) Prior Publication Data
US 2021/0380769 A1    Dec. 9, 2021

(30) Foreign Application Priority Data

Aug. 23, 2018  (JP) ................ 2018-155934
Aug. 23, 2018  (JP) ................ 2018-155935

(51) Int. Cl.
| | |
|---|---|
| *C08J 5/18* | (2006.01) |
| *B29C 48/88* | (2019.01) |
| *B29C 48/08* | (2019.01) |
| *B29C 48/00* | (2019.01) |
| *B29C 71/02* | (2006.01) |
| *B29C 71/04* | (2006.01) |
| *C23C 14/20* | (2006.01) |
| *H01G 4/32* | (2006.01) |
| *H01G 4/33* | (2006.01) |

(52) U.S. Cl.
CPC ............ *C08J 5/18* (2013.01); *B29C 48/0018* (2019.02); *B29C 48/08* (2019.02); *B29C 48/914* (2019.02); *B29C 71/02* (2013.01); *B29C 71/04* (2013.01); *B32B 2457/16* (2013.01); *C08J 2323/12* (2013.01); *C23C 14/20* (2013.01); *H01G 4/32* (2013.01); *H01G 4/33* (2013.01)

(58) Field of Classification Search
None
See application file for complete search history.

(56) References Cited

U.S. PATENT DOCUMENTS

| | | | |
|---|---|---|---|
| 2015/0119543 A1* | 4/2015 | Suzuki | .............. B29C 55/18 526/351 |
| 2016/0304681 A1 | 10/2016 | Potter et al. | |
| 2020/0198298 A1 | 6/2020 | Imanishi et al. | |

FOREIGN PATENT DOCUMENTS

| | | | | |
|---|---|---|---|---|
| EP | 3 124 205 A1 | 2/2017 | | |
| EP | 3 124 523 A1 | 2/2017 | | |
| EP | 3124523 A1 * | 2/2017 | ........... | B29C 55/005 |
| EP | 3 296 348 A1 | 3/2018 | | |
| JP | H08-73529 A | 3/1996 | | |
| JP | H10-156940 A | 6/1998 | | |
| JP | 2003-105102 A | 4/2003 | | |
| JP | 2003-191324 A | 7/2003 | | |
| JP | 2006-082383 A | 3/2006 | | |
| JP | 2010-280795 A | 12/2010 | | |
| JP | 2013-177645 A | 9/2013 | | |
| JP | 2014-055276 A | 3/2014 | | |
| JP | 2014/205344 * | 10/2014 | ............ | B32B 27/32 |
| JP | 2017-500226 A | 1/2017 | | |
| WO | 2015/012324 A1 | 1/2015 | | |
| WO | 2015/146893 A1 | 10/2015 | | |
| WO | 2015/146894 A1 | 10/2015 | | |
| WO | 2016/182003 A1 | 11/2016 | | |
| WO | 2019/044758 A1 | 3/2019 | | |

OTHER PUBLICATIONS

Kuman—JP 2014-205344 A—Euro D6—MT—PP w—storage mod values at 130 and 150C—2014 (Year: 2014).*
Motonobu Kawai, "Expansion of Film Capacitor Applications; From Cars to Renewable Energy," Nikkei Electronics, Nikkei Business Publication, Sep. 17, 2012, pp. 57 to 62, including an English Summary.

* cited by examiner

Primary Examiner — John Vincent Lawler
(74) Attorney, Agent, or Firm — DLA Piper LLP (US)

(57) ABSTRACT

A polypropylene film has an excellent long-term operating reliability in a high temperature environment when used in a high-voltage capacitor, which is suitable for use in such capacitor applications and the like, and which has an excellent structural stability to heat; and a metal film-laminated film and a film capacitor including the same. The polypropylene film, wherein the relationship between the sum (E'135 (MD+TD)) of the storage moduli in the machine direction and the transverse direction of the film, as determined by solid viscoelasticity measurement at 135° C., and the sum (E'125(MD+TD)) of the storage moduli, as determined by solid viscoelasticity measurement at 125° C., satisfies formula (1):

$E'135(MD+TD)/E'125(MD+TD) > 0.7$    (1).

15 Claims, No Drawings

POLYPROPYLENE FILM, METAL FILM LAMINATED FILM USING SAME, AND FILM CAPACITOR

TECHNICAL FIELD

This disclosure relates to a polypropylene film that is particularly suitably used in a capacitor application.

BACKGROUND

Polypropylene films have excellent transparency, mechanical properties, electrical properties and the like, and are used in various applications such as packaging, tape, and electrical applications including cable wrappings and capacitors.

In capacitor applications among the above, polypropylene films are particularly preferably used in high-voltage capacitors regardless of direct current or alternate current because of their excellent voltage resistance and low loss characteristics.

In recent years, various electrical appliances are increasingly becoming inverter-based, and with such a trend, the demand for a reduction in size and an increase in capacitance of capacitors are on the rise more than ever. In such fields, particularly due to demands from automotive applications (including hybrid car applications) as well as solar power generation and wind power generation applications, it has now become essential for polypropylene films to achieve a reduction in film thickness and an improvement in breakdown voltage, as well as an excellent reliability that allows for maintenance of film characteristics when used for a long period of time in a high temperature environment.

Polypropylene films are regarded as having a higher heat resistance and breakdown voltage, among polyolefin-based films. When used in the above mentioned fields, on the other hand, it is important that an excellent dimensional stability at an operating environment temperature, and stable electrical performance such as electric resistance at a temperature range 10 to 20° C. higher than the operating environment temperature be provided. From the viewpoint of heat resistance, the operating environment temperature will be higher in the future, assuming the use in a power semiconductor application using a silicon carbide (SiC). Due to demands for capacitors to have a higher heat resistance and a higher voltage resistance, an improvement in film breakdown voltage in a high temperature environment of higher than 110° C. is needed. However, as described in Motonobu Kawai, "Expansion of Film Capacitor Applications; From Cars to Renewable Energy," Nikkei Electronics, Nikkei Business Publication, Sep. 17, 2012, pp 57 to 62, the upper limit of the operating temperature of a polypropylene film is about 110° C., and it has been extremely difficult to stably maintain the breakdown voltage under such a temperature environment.

So far, the following techniques have been proposed as a means of obtaining an excellent performance in a high temperature environment when a polypropylene film is formed into a thin film and used as a capacitor. For example, there have been proposed a film in which the change in the storage modulus at 125° C. relative to the storage modulus at room temperature is controlled to decrease, thereby achieving an improvement in the breakdown voltage (for example, WO 2015/146894 A1). Also proposed is the use of a propylene homopolymer in which the change in the storage modulus at 120° C. relative to the storage modulus at room temperature can be controlled, which has an improved rigidity, heat resistance and transparency, and which is suitable for use as a biaxially stretched polypropylene film (for example, JP H08-73529 A). Further, it is important to increase the elastic modulus of a film to increase the breakdown voltage in a high temperature environment, and the following films have been proposed for the purpose of increasing the tensile modulus at room temperature. For example, there have been proposed: a film in which a polypropylene resin raw material having a low crystallinity is used, but in which the area stretching ratio is increased by simultaneous biaxial stretching (for example, JP 2013-177645 A); a film in which the transition point of microcrystal mobility is controlled by mixing an isotactic polypropylene resin having a low degree of stereoregularity to a polypropylene resin as a main constituent component (for example, JP 2010-280795 A); and a film in which a polypropylene resin having an increased crystallinity is used, and which is subjected to sequential biaxial stretching, followed by longitudinal re-stretching, to improve the strength in the machine direction (for example, JP H10-156940 A). Further, a film has been proposed in which a petroleum resin is mixed during film formation so that the stretching ratio in the machine direction is controlled to increase due to plasticizing effect for the purpose of increasing the elastic modulus not only at room temperature but also at a high temperature (for example, JP 2003-191324 A and JP 2003-105102 A). However, in all the polypropylene films disclosed in WO '894, JP '645, JP '795, JP '940, JP '529, JP '324 and JP '102, an improvement in the breakdown voltage in a high temperature environment of higher than 110° C. is insufficient. Further, it cannot be said that such films provide sufficient reliability when formed into capacitors and used in a high temperature environment for a long period of time.

We believe that the polypropylene films disclosed above have an insufficient breakdown voltage in a high temperature environment, and an insufficient long-term operating reliability in a high temperature environment when formed into a capacitor, because of the following reasons.

That is, in the polypropylene film disclosed in WO '894, although the film has a sufficient voltage resistance and reliability as a capacitor in an environment of 105° C., the heat treatment in the film formation process is not necessarily sufficient, assuming the use in an environment of a further higher temperature. Further, it is difficult to increase the degree of crystallinity due to a large amount of cold xylene soluble component (CXS) contained in the raw material. In addition, when the storage modulus at a high temperature was measured, assuming the use at a high temperature, the presence of temperature dependence, which is a phenomenon that a higher temperature results in a lower storage modulus, was confirmed. These were thought to be the reason for the above problems.

In the polypropylene film disclosed in JP '529, which is a film suitable for a flexible packaging application, a raw material having a low stereoregularity is used, and the stretching ratio in the transverse direction and the area stretching ratio are low. These resulted in an insufficient structural stability in a high temperature range, which was thought be the reason for the above problems.

In the polypropylene film disclosed in JP '795, a raw material having a low stereoregularity is used, the stretching ratio in the transverse direction and the area stretching ratio are low, and no heat treatment was performed after transverse stretching. These resulted in a decrease in the storage modulus at a high temperature, which was thought be the reason for the above problems.

In the polypropylene films disclosed in each of JP '940, JP '324 and JP '102, although a polypropylene resin having a high stereoregularity is used, the overall degree of crystallinity is low due to a high cold xylene soluble component (CXS) content; the preheating temperature before the transverse stretching is low; and a slow cooling treatment was not performed at a heat treatment temperature after the transverse stretching. These resulted in an insufficient stabilization of the molecular chain orientation structure, leading to in a decrease in the storage modulus at a high temperature, which was thought be the reason for the above problems.

Therefore, it could be helpful to provide a polypropylene film having an excellent long-term operating reliability in a high temperature environment that is suitable for use in capacitors and the like to be used under high temperature and high voltage conditions, and having an excellent structural stability to heat, as well as a metal film-laminated film and a film capacitor using the same.

SUMMARY

We found a polypropylene film in which the temperature dependence of the storage moduli at 125° C. and 135° C. is equal to or higher than a certain value. Accordingly, a polypropylene film in which the relationship between the sum (E'135 (MD+TD)) of the storage moduli in the machine direction and the transverse direction of the film, as determined by solid viscoelasticity measurement at 135° C., and the sum (E'125 (MD+TD)) of the storage moduli, as determined by solid viscoelasticity measurement at 125° C., satisfies formula (1):

$$E'135(MD+TD)/E'125(MD+TD) > 0.7 \qquad (1).$$

We thus provide a polypropylene film having an excellent long-term operating reliability in a high temperature environment that is suitable for use in capacitors and the like to be used under high temperature and high voltage conditions, has an excellent structural stability to heat and provides a metal film-laminated film and a film capacitor using the same.

DETAILED DESCRIPTION

The polypropylene film is hereinafter also simply referred to as "film." Our polypropylene film is not a microporous film, and thus does not have a large number of pores.

It is necessary that the relationship between the sum (E'135 (MD+TD)) of the storage moduli in the machine direction and the transverse direction of the film, as determined by solid viscoelasticity measurement at 135° C., and the sum (E'125 (MD+TD)) of the storage moduli, as determined by solid viscoelasticity measurement at 125° C., satisfies formula (1):

$$E'135(MD+TD)/E'125(MD+TD) > 0.7 \qquad (1).$$

The value of E'135 (MD+TD)/E'125 (MD+TD) is preferably 0.73 or more, more preferably 0.76 or more, and most preferably 0.78 or more. A film having a higher value of formula (1) has a higher breakdown voltage at a high temperature, and provides a better long-term reliability in a high temperature environment when formed into a capacitor.

We found that there is a high correlation between the temperature dependence E'135 (MD+TD)/E'125 (MD+TD) of the storage moduli in the machine direction and the transverse direction of the film, and the long-term reliability at a high temperature of the resulting capacitor. As a result, we discovered that it is important to control the temperature dependence of the storage modulus to be reduced in the temperature range higher than the operating environment temperature, particularly in the long-term reliability of the capacitor. The fact that the ratio of the storage moduli at 135° C. and 125° C. satisfies the above mentioned relationship means that the temperature dependence of the storage modulus at a high temperature is low and, in particular, that the motion and relaxation of molecular chains in the film are reduced in a high temperature environment, and thus the film has a structure which is extremely stable to heat. We further discovered that, for the polypropylene film to satisfy the relationship of the above described formula, it is effective to increase the area stretching ratio, particularly, to increase the stretching ratio in the transverse direction, in the stretching process during the film formation. On the other hand, we found out that the heat shrinkage tends to increase due to the strain caused by stretching. Thus, we found that the polypropylene film can be obtained more easily, as will be described later, by: using a polypropylene raw material having a high meso pentad fraction and a cold xylene soluble component (CXS) content of less than 1.5% by mass; setting the area stretching ratio in biaxial stretching to 60 times or more; setting the preheating temperature immediately before the biaxial stretching in the transverse direction after uniaxial stretching in the machine direction, to 5° C. to 15° C. higher than the stretching temperature in the transverse direction; and subjecting the film to a multi-stage heat-set treatment and a relaxation treatment, as appropriate, as follows. Specifically, in the heat-set treatment and relaxation treatment process after the biaxial stretching, the film is first subjected to a relaxation treatment while carrying out a heat treatment (first stage) at a temperature lower than the stretching temperature in the transverse direction. Subsequently, the film is subjected to a heat treatment (second stage) at a temperature lower than the heat treatment temperature in the first stage and 135° C. or higher, while maintaining the tension in the transverse direction of the film, and then to a heat treatment (third stage) at a temperature of 80° C. or higher and less than the heat treatment temperature in the second stage. On the other hand, when the value of E'135 (MD+TD)/E'125 (MD+TD) is 0.7 or less, and when the film is used as a capacitor in a high temperature environment where a high voltage is applied, particularly when placed in a high temperature state for a long period of time, relaxation of molecular chains in the film causes a decrease in voltage resistance, a decrease in the capacitance of the capacitor, the occurrence of short-circuit destruction and/or the like, resulting in a capacitor having poor reliability. The upper limit of the value of the above described relational formula is not particularly limited, but is practically 0.99 or less. To increase the value of E'135 (MD+TD)/E'125 (MD+TD) to a value greater than 0.99, the stretching ratio during film formation needs to be increased, which may cause the occurrence of rupture.

The term "machine direction (or longitudinal direction)" refers to the direction (sometimes referred to as "MD") corresponding to the direction of flow in the film production process, and the term "transverse direction" refers to the direction (sometimes referred to as "TD") orthogonal to the direction of flow in the film production process. In a film sample in the form of a reel, a roll or the like, the direction in which the film is wound can be referred to as the machine direction. On the other hand, in a film in which it is uncertain from its appearance whether which direction corresponds to the direction of flow in the film production process, the direction is determined, for example, as follows. Specifically, lines are drawn on the film every 15° based on an arbitrary straight line on a surface of the film; slits are made in parallel to the respective lines, to obtain film sample pieces; the rupture strengths of the film samples are measured using a tensile tester, and the direction in which the maximum rupture strength is obtained is deemed as the transverse direction of the film. Further, the direction orthogonal to the transverse direction of the film is deemed as the machine direction. Although details will be described later, when the width of a sample is less than 50 mm and the rupture strength cannot be determined by a tensile tester, the crystal orientation of the (110) plane of α crystal of the polypropylene film is measured by wide-angle X-ray diffraction, as follows, and the machine direction and the transverse direction of the film are determined based on the following criteria. Specifically, an X-ray is irradiated in the direction perpendicular to the film surface and the crystal peak at 2θ=about 14° (the (110) plane of α crystal) is scanned in the circumferential direction and, in the resulting diffraction intensity distribution, the direction with a high diffraction intensity is deemed as the transverse direction of the film, and the direction orthogonal thereto is deemed as the machine direction.

The storage modulus in the transverse direction of the film, as determined by solid viscoelasticity measurement at 135° C., is preferably 0.8 GPa or more, more preferably 0.9 GPa or more, and still more preferably 1.0 GPa or more. When the thus determined storage modulus is 0.8 GPa or more, it means that the film has a structure in which the molecular chains in the film are highly oriented and tense in the transverse direction, in a high temperature environment. When such a film is used as a capacitor in a high temperature environment where a high voltage is applied, particularly during a long-term use at a high temperature, it is possible to obtain a capacitor having a high reliability in which: contact failure between metallikon at the ends of the element and a vapor-deposited metal is reduced; the voltage resistance is increased; a decrease in the capacitance of the capacitor is reduced, and/or the occurrence of short-circuit destruction is reduced. A polypropylene film in which the storage modulus in the transverse direction at 135° C. is adjusted within the above described preferred range can be obtained, for example, by: using a polypropylene raw material having a high meso pentad fraction and a cold xylene soluble component (CXS) content of less than 1.5% by mass; setting the stretching ratio in the transverse direction to 11 times or more during biaxial stretching; and setting the preheating temperature immediately before the biaxial stretching in the transverse direction after uniaxial stretching in the machine direction, to 5° C. to 15° C. higher than the stretching temperature in the transverse direction. The upper limit of the storage modulus in the transverse direction of the film, as determined by solid viscoelasticity measurement at 135° C., is not particularly limited. However, the upper limit is practically 5 GPa or less, from the viewpoint of productivity.

The sum (E'130 (MD+TD)) of the storage moduli in the machine direction and the transverse direction of the film, as determined by solid viscoelasticity measurement at 130° C., is 1.6 GPa or more. The value of E'130 (MD+TD) is preferably 1.7 GPa or more, more preferably 1.9 GPa or more, and most preferably 2.1 GPa or more. A polypropylene film in which the storage moduli at 130° C. is adjusted to 1.6 GPa or more can be obtained, for example, by increasing the area stretching ratio in the stretching process during the film formation, particularly, increasing the stretching ratio in the transverse direction, and using a polypropylene raw material having a high meso pentad fraction and a cold xylene soluble component (CXS) content of less than 1.5% by mass.

On the other hand, when the value of E'130 (MD+TD) is less than 1.6 GP, and when the film is used as a capacitor in a high temperature environment where a high voltage is applied, relaxation of the molecular chains in the crystal portion of the polypropylene contained in the film may proceed, during the long-term use of the capacitor, to cause a decrease in voltage resistance. This may lead to problems such as a decrease in the capacitance of the capacitor and destruction due to short circuiting, possibly resulting in a capacitor having a poor voltage resistance and reliability. The upper limit of the value of the sum (E'130 (MD+TD)) of the storage moduli in the machine direction and the transverse direction of the film, as determined by solid viscoelasticity measurement at 130° C., is not particularly limited. However, the upper limit is 10.0 GPa or less, from the viewpoint of productivity.

The sum (E'135 (MD+TD)) of the storage moduli in the machine direction and the transverse direction of the film, as determined by solid viscoelasticity measurement at 135° C.; the sum (E'130 (MD+TD)) of the storage moduli in the machine direction and the transverse direction of the film, as determined by solid viscoelasticity measurement at 130° C.; the sum (E'125 (MD+TD)) of the storage moduli in the machine direction and the transverse direction of the film, as determined by solid viscoelasticity measurement at 125° C.; and the storage modulus in the transverse direction of the film, as determined by solid viscoelasticity measurement at 135° C.; are measured by the measurement methods described in detail below.

The loss tangent (tan δ 23) in the transverse direction of the film, as determined by solid viscoelasticity measurement at 23° C., is preferably 0.06 or less. The loss tangent (tan δ) is the ratio of the loss modulus (E") to the storage modulus (E'), and is determined from the formula [tan δ=E"/E']. That is, a lower value of the loss tangent (tan δ) indicates a more reduced molecular mobility. The loss tangent (tan δ23) is more preferably 0.055 or less, and still more preferably 0.05 or less. Controlling the value of the tan δ23 within such a range, and to a lower value, leads to a more improved reliability, when the film is used as a capacitor in a high voltage and high temperature environment, particularly during a long-term use at a high temperature. The lower limit of the tan δ23 is not particularly limited, but is practically about 0.01. To reduce the tan δ23 to a value lower than 0.01, the stretching ratio during film formation needs to be increased, which may cause problems from the viewpoint of film formation stability such as inducing rupture. A polypropylene film in which the loss tangent (tan δ23) in the transverse direction of the film at 23° C. is adjusted to 0.06 or less, can be obtained, for example, by using a polypropylene raw material having a high meso pentad fraction and a cold xylene soluble component (CXS) content of less than 1.5% by mass; setting the stretching ratio in the transverse direction to 10.5 times or more, and the area stretching ratio to 62 times or more, during biaxial stretching; and setting the preheating temperature immediately before the biaxial stretching in the transverse direction after uniaxial stretching in the machine direction, to 5° C. to 15° C. higher than the stretching temperature in the transverse direction.

The loss tangent (tan δ23) in the transverse direction of the film, as determined by solid viscoelasticity measurement at 23° C., is measured by the measurement method described in detail below.

The heat shrinkage stress value in the machine direction of the film, as determined using a thermomechanical analyzer at 135° C., is preferably 2.0 MPa or less, more preferably 1.7 MPa or less, still more preferably 1.4 MPa or less, and most preferably 1.1 MPa or less. When the heat shrinkage stress value in the machine direction of the film, as determined using a thermomechanical analyzer at 135° C., is 2.0 MPa or less, it is possible to reduce the shrinkage of the film itself due to heat in the production process and the utilization process of the capacitor. This prevents the tight winding of the element, and allows an adequate gap to be maintained between film layers. As a result, a self-recovery function (self-healing) is activated, thereby enabling reduction of the occurrence of penetrating destruction which entails a rapid decrease in the capacitance, and to increase the reliability as a capacitor. The lower limit of the heat shrinkage stress value in the machine direction of the film, as determined using a thermomechanical analyzer at 135° C., is not particularly limited, but is practically about 0.1 MPa. When the shrinkage stress is lower than 0.1 MPa the shrinkage of the film itself due to heat in the production process and the utilization process of the capacitor may be insufficient, possibly resulting in a failure to provide a sufficient capacitance with respect to the design capacitance. A polypropylene film in which the heat shrinkage stress value in the machine direction of the film, as determined using a thermomechanical analyzer at 135° C., is adjusted within the preferred range can be obtained, for example, by using a polypropylene raw material having a high meso pentad fraction and a cold xylene soluble component (CXS) content of less than 1.5% by mass; setting the stretching ratio in the transverse direction to 10.5 times or more, and the area stretching ratio to 60 times or more, during biaxial stretching; and setting the preheating temperature immediately before the biaxial stretching in the transverse direction after uniaxial stretching in the machine direction, to 5° C. to 15° C. higher than the stretching temperature in the transverse direction.

The heat shrinkage stress value in the machine direction of the film at 130° C., as determined by the measurement of the heat shrinkage stress value using a thermomechanical analyzer, is preferably 2.0 MPa or less. The heat shrinkage stress value in the machine direction of the film at 130° C. is more preferably 1.6 MPa or less, and most preferably 1.2 MPa or less. When the stress value in the machine direction of the film at 130° C. is more than 2.0 MPa, it may lead to the occurrence of the shrinkage of the film itself due to heat in the production process and the utilization process of the capacitor. This causes the tight winding of the element to result in the loss of an adequate gap between films, making it difficult for the self-recovery function (self-healing) to be activated. As a result, there are possibilities that the reliability of the capacitor may be decreased, wrinkles may occur during the transportation process to deteriorate processability, and/or the short-circuit destruction that penetrates through a plurality of film layers laminated one on another may occur upon dielectric breakdown. The lower limit of the stress value in the machine direction of the film at 130° C. is not particularly limited. However, the lower limit is about 0.1 MPa, from the viewpoint of the capacitance when formed into a capacitor. A polypropylene film in which the heat shrinkage stress value in the machine direction of the film at 130° C. is adjusted within the above described preferred range can be obtained as will be described later, for example, by: using a polypropylene raw material having a high meso pentad fraction and a cold xylene soluble component (CXS) content of less than 1.5% by mass; setting the area stretching ratio to 60 times or more; and setting the preheating temperature immediately before biaxial stretching in the transverse direction after uniaxial stretching in the machine direction to 5° C. to 15° C. higher than the stretching temperature in the transverse direction.

The heat shrinkage stress value in the transverse direction of the film at 130° C., as determined by the measurement of the heat shrinkage stress value using a thermomechanical analyzer, is preferably 2.0 MPa or less. The heat shrinkage stress value in the transverse direction of the film at 130° C. is more preferably 1.6 MPa or less, and most preferably 1.2 MPa or less. When the heat shrinkage stress value in the transverse direction of the film at 130° C. is more than 2.0 MPa, the shrinkage of the film may occur due to heat in the production process or the operating environment, to cause a decrease in the vapor deposition area of aluminum. This may lead to a decrease in the capacitance of the capacitor, or the occurrence of wrinkles during the transportation process to result in the deterioration of processability. The lower limit of the heat shrinkage stress value in the transverse direction of the film at 130° C. is not particularly limited; however, the lower limit is about 0.1 MPa, from the viewpoint of the capacitance when formed into a capacitor. A polypropylene film in which the heat shrinkage stress value in the transverse direction of the film at 130° C. is adjusted within the above described preferred range can be obtained as will be described later, for example, by: using a method a polypropylene raw material having a high meso pentad fraction and a cold xylene soluble component (CXS) content of less than 1.5% by mass; and setting the stretching ratio in the transverse direction to 10.5 times or more, and the area stretching ratio to 60 times or more, during biaxial stretching.

The heat shrinkage stress value in the machine direction of the film at 135° C., and the heat shrinkage stress value in the machine direction or the transverse direction at 130° C., are measured by the measurement method using a thermomechanical analyzer, described in detail below.

The heat shrinkage in the transverse direction of the film, as determined by subjecting the film to a heat treatment at 125° C. for 15 minutes, is preferably 0.6% or less, more preferably 0.4% or less, and still more preferably 0.2% or less. The lower limit of the heat shrinkage is not particularly limited, but is practically about −2%. When the heat shrinkage is 0.6% or less, it is possible to reduce the shrinkage of the film itself due to heat in the production process and the utilization process of the capacitor, and to avoid contact failure with metallikon at the ends of the element, thereby enabling to increase the voltage resistance, and to prevent a decrease in the capacitance caused by the deformation of the element, or the occurrence of short-circuit destruction.

Further, the heat shrinkage in the transverse direction of the film, as determined by subjecting the film to a heat treatment at 135° C. for 10 minutes, is preferably 1% or less, more preferably 0.6% or less, and still more preferably 0.3% or less. The lower limit of the heat shrinkage is not particularly limited, but is practically about −2%. When the heat shrinkage is 1% or less, it is possible to prevent the contact failure between vapor deposited film electrode portions and metallikon electrode portions, in the aging treatment after performing metallikon (metal spraying) in the capacitor production process, to obtain a capacitor element having a capacitance as designed. Further, deformation of the element can be reduced, particularly during a long-term use at a high temperature, thereby preventing a decrease in the capacitance or the occurrence of short-circuit destruction. A polypropylene film in which the heat shrinkage in the transverse direction of the film in the heat treatment at 125° C. for 15 minutes, and the heat shrinkage in the transverse direction in the heat treatment at 135° C. for 10 minutes, are adjusted within the preferred ranges can be obtained, for example, by: setting the area stretching ratio to 62 times or more; setting the preheating temperature immediately before biaxial stretching in the transverse direction after uniaxial stretching in the machine direction, to 5° C. to 15° C. higher than the stretching temperature in the transverse direction; and subjecting the film to a multi-stage heat-set treatment and a relaxation treatment, as appropriate, as follows. Specifically, in the heat treatment and relaxation treatment process after the biaxial stretching, the film is first subjected to a relaxation treatment while carrying out a heat treatment (first stage) at a temperature lower than the stretching temperature in the transverse direction. Subsequently, the film is subjected to a heat treatment (second stage) at a temperature lower than the heat treatment temperature in the first stage and 135° C. or higher, while maintaining the tension in the transverse direction of the film, and then to a heat treatment (third stage) at a temperature of 80° C. or higher and less than the heat treatment temperature in the second stage.

The heat shrinkage in the transverse direction of the film, as determined by subjecting the film to a heat treatment at 125° C. for 15 minutes, and the heat shrinkage in the transverse direction of the film, as determined by subjecting the film to a heat treatment at 135° C. for 10 minutes, are measured by the measurement method described in detail below.

The degree of bias of roughness shape, that is, the degree of bias of unevenness of the surface protrusions (also called "skewness" and referred to as Ssk), on at least one surface of the film, is more than −10 and less than 100 to exhibit a high breakdown voltage even in a high temperature environment, and provide voltage resistance and reliability in a high temperature environment when formed into a capacitor. The term "Ssk" is a parameter indicating the degree of bias of unevenness on the surface. The Ssk is a value indicating the cubic mean of $Z(x,y)$, on a reference plane that has been non-dimensionalized by the cube of the root mean square height Sq, and represents skewness. The Ssk is an index indicating symmetry of mountains and valleys, with respect to the average plane as the center. An Ssk lower than 0 indicates a bias toward the lower side with respect to the mean line, that is, a greater presence of valleys than mountains. On the other hand, an Ssk higher than 0 indicates a bias toward the upper side with respect to the mean line, namely, a greater presence of mountains than valleys. An Ssk of 0 indicates that there is no bias with respect to the mean line. When the Ssk is adjusted within the above described range, mountains are formed moderately, to provide a good slippage between films or between the film and a transport roll. Further, a relatively lower presence of valleys enables to decrease the region of thinned portions in the film, whereby the possible occurrence of dielectric breakdown at the thinned portions can be reduced. As a result, it is possible to achieve an improvement in the overall breakdown voltage, when the film is formed into a capacitor.

From the viewpoints described above, the lower limit of the Ssk is preferably more than 0, and most preferably more than 1. On the other hand, the upper limit of the Ssk is preferably less than 50, and most preferably less than 10. An Ssk of −10 or less indicates a greater presence of recessed shapes on the film surface, which leads to a decrease in the breakdown voltage. As a result, the resulting film is more likely to be disadvantageous for use in high-voltage capacitor applications. On the other hand, a degree of bias Ssk of more than 100 indicates an excessive presence of mountains on the film surface, which makes gaps to be easily formed between films when the films are laminated to be formed into a capacitor. As a result, a decrease in the capacitance is more likely to occur, and the voltage resistance may be lost. A polypropylene film in which the Ssk is adjusted within the above described range can be obtained, for example, by: controlling the casting drum temperature within a preferred range; controlling the stretching temperature in the machine direction within a preferred range; and setting the area stretching ratio to 62 times or more, and the stretching ratio in the transverse direction to 10.5 times or more, during biaxial stretching.

The total volume of valleys having a depth of 20 nm or more in a region of 1,252×939 μm, on at least one surface of the film, is preferably from 1 to 12,000 μm$^3$, because an improvement in element processability and in voltage resistance can be achieved, when the film has a moderate slippage while having a smaller number of surface recesses. The lower limit of the total volume of valleys is more preferably 300 μm$^3$ or more, and most preferably 600 μm$^3$ or more. Further, the upper limit of the total volume of valleys is more preferably 5,000 μm$^3$ or less, and most preferably 1,000 μm$^3$ or less. When the total volume of valleys is less than 1 μm$^3$, the film is prone to have no surface unevenness and to be flat. In this example, slippage of the film is extremely decreased to result in a poor handleability, or the film may be more easily wrinkled, having an impact on the element processability. Further, there are possibilities that the change in the capacitance may be increased due to the influence of wrinkles and the like, when used as a capacitor for long period of time, or that the self-recovery function (self-healing) may be difficult to be activated due to the absence of moderate gaps between films, when the films are laminated to form a laminated capacitor, resulting in a decrease in the reliability of the capacitor. When the total volume of valleys is more than 12,000 μm$^3$, on the other hand, the region of thinned portions in the film is locally increased, and dielectric breakdown may occur from the thinned portions. As a result, there are possibilities that the voltage resistance of the film is decreased, particularly, the voltage resistance and reliability in a high temperature environment may be lost, when used in high-voltage capacitor applications. A polypropylene film in which the total volume of valleys is controlled within the above described preferred range can be obtained, for example, by: controlling the casting drum temperature within a preferred range; controlling the stretching temperature in the machine direction within a preferred range; and setting the area stretching ratio to 60 times or more, and the stretching ratio in the transverse direction to 10.5 times or more, during biaxial stretching.

The arithmetic mean height Sa on at least one surface of the film is preferably from 10 to 60 nm, from the viewpoint of providing a moderate roughness to the film surface to increase the uniformity of gaps between films, the slippage between films or between the film and a transport roll, the processability during the production of a capacitor element, and the reliability as a capacitor. The lower limit of the arithmetic mean height Sa is more preferably 15 nm or more, and most preferably 20 nm or more. The upper limit of the arithmetic mean height Sa is more preferably 50 nm or less, and most preferably 40 nm or less. When the above described Sa is less than 10 nm, the slippage of the film may be extremely decreased, possibly resulting in a poor handleability, and there may be an impact on the element processability such as the occurrence of wrinkles. Further, there are possibilities that the change in the capacitance may be increased due to the influence of wrinkles and the like, when used as a capacitor for long period of time, or that the self-recovery function (self-healing) may be difficult to be activated due to the absence of moderate gaps between films, when the films are laminated to form a laminated capacitor, resulting in a decrease in the reliability of the capacitor. When the Sa on at least one surface is more than 60 nm, on the other hand, there may be an adverse effect on the voltage resistance.

The maximum height Sz on at least one surface of the film is preferably from 100 to 1,000 nm, from the viewpoint of providing a moderate roughness to the film surface to increase the uniformity of gaps between films, the slippage between films or between the film and a transport roll, the processability during the production of a capacitor element, and the reliability as a capacitor. The upper limit of the maximum height Sz is more preferably 800 nm or less, and still more preferably, 500 nm or less. When the maximum height Sz on at least one surface of the film is less than 100 nm, the slippage of the film may be extremely decreased, possibly resulting in a poor handleability, and there may be an impact on the element processability such as the occurrence of wrinkles. Further, there are possibilities that the change in the capacitance may be increased due to the influence of wrinkles and the like when used as a capacitor for long period of time, or that the self-recovery function (self-healing) may be difficult to be activated due to the absence of moderate gaps between films, when the films are laminated to form a laminated capacitor, resulting in a decrease in the reliability of the capacitor. When the Sz on at least one surface is more than 1,000 nm, on the other hand, coarse protrusions may be present, and the coarse protrusions may cause a decrease in the voltage resistance. Further, the uniformity of thickness is less likely to be obtained, and thus there is a possibility to cause a large change in the capacitance due to the influence of wrinkles and the like, when used as a capacitor for a long period of time. A polypropylene film in which the Sa and the Sz are controlled within the above described preferred ranges can be obtained, for example, by: controlling the casting drum temperature within a preferred range; controlling the stretching temperature in the machine direction within a preferred range, and setting the preheating temperature immediately before biaxial stretching in the transverse direction after uniaxial stretching in the machine direction, to 5° C. to 15° C. higher than the stretching temperature in the transverse direction.

The degree of bias of the roughness shape (Ssk) of the film surface, the total volume of valleys having a depth of 20 nm or more in a region of 1,252 μm×939 μm of the film surface as well as the arithmetic mean roughness (Sa) and the maximum height (Sz) of the film surface, are measured by the measurement methods described in detail below.

It is desired that the degree of bias of the roughness shape (Ssk) of the film surface, the total volume of valleys having a depth of 20 nm or more in a region of 1,252 μm×939 μm of the film surface, as well as the arithmetic mean roughness (Sa) and the maximum height (Sz) of the film surface, be within the above described preferred ranges, as values determined on the same surface of the film.

The polypropylene film preferably has a meso pentad fraction of 0.970 or more. The meso pentad fraction is preferably 0.975 or more, more preferably 0.980 or more, and most preferably 0.983 or more.

The meso pentad fraction is an index indicating the stereoregularity of a crystal phase of polypropylene, measured by the nuclear magnetic resonance method (NMR method). A higher numerical value of the meso pentad fraction indicates a higher degree of crystallinity, a higher melting point, a higher effect of increasing the storage modulus at a high temperature, and a higher ability to improve the breakdown voltage in a high temperature environment, and thus is preferred. The upper limit of the meso pentad fraction is not particularly limited (that is, 1.0 is the upper limit). Particularly one prepared using a so-called Ziegler-Natta catalyst is preferred as a polypropylene resin having a high meso pentad fraction, and a method in which an electron-donating component is appropriately selected, for example, is preferably used. The polypropylene resin thereby prepared can have a molecular weight distribution (Mw/Mn) of 3.0 or more, and an amount of 2,1 erythro regio-defects of 0.1 mol % or less. The use of such a polypropylene resin is preferred. When the polypropylene resin has a meso pentad fraction of less than 0.970, the polypropylene has a low stereoregularity, which may lead to a decrease in the strength or a decrease in the breakdown voltage of the film in a high temperature environment, or may result in the occurrence of film rupture during the step of forming a metal film by vapor deposition or the step of winding the capacitor element, and during the transportation of the film to such a step.

The polypropylene resin to be used in the polypropylene film preferably has a melting point of 164° C. or higher, more preferably 165° C. or higher, and still more preferably 166° C. or higher. When the polypropylene resin has a melting point of less than 164° C., the resin has a low crystallinity, which may lead to a low storage modulus at a high temperature, or a decrease in the breakdown voltage or a decrease in the thermal dimensional stability of the film in a high temperature environment, or may result in the occurrence of film rupture during the transportation of the film in the step of forming a metal film by vapor deposition or the step of winding the capacitor element.

When the film is completely dissolved in xylene and then allowed to precipitate at room temperature, the amount of polypropylene component dissolved in xylene (also referred to as CXS: cold xylene soluble component) is preferably less than 1.5% by mass. The cold xylene soluble component (CXS) is thought to correspond to a component which is difficult to crystalize due to reasons such as having a low stereoregularity and a low molecular weight. An amount of CXS of more than 1.5% by mass may cause problems such as deterioration of the temperature dependence of the storage modulus of the film at a high temperature, a decrease in the absolute value of the storage modulus at a high temperature, a decrease in the breakdown voltage, a decrease in the thermal dimensional stability, and an increase in leakage current. Accordingly, the amount of CXS is more preferably 1.3% by mass or less, still more preferably 1.1% by mass or less, and most preferably 0.9% by mass or less. To achieve such a CXS content, it is possible to use, for example, a method of increasing the catalytic activity during preparation of the polypropylene resin to be used, or a method of washing the resulting polypropylene resin with a solvent or the propylene monomer itself. Since the amount of the cold xylene soluble component is the lower the more preferred, the lower limit thereof is not particularly limited. However, it is economically advantageous to adjust the amount of CXS to 0.1% by mass or more.

The polypropylene to be used in the polypropylene film preferably has a melt flow rate (MFR) of from 1 to 10 g/10 minutes (at 230° C. and at a load of 21.18 N), more preferably from 2 to 5 g/10 minutes (at 230° C. and at a load of 21.18 N), from the viewpoint of film forming property. To adjust the melt flow rate (MFR) to the above described value, a method of controlling the average molecular weight or the molecular weight distribution is used, for example.

The polypropylene to be used in the polypropylene film is mainly composed of a homopolymer of propylene, but may contain a copolymerization component obtained from another unsaturated hydrocarbon, or may be blended with a polymer other than polypropylene homopolymers, as long as the desired effect is not impaired. Examples of monomer components other than propylene, constituting such a copolymerization component or blended product, include ethylene, 1-butene, 1-pentene, 3-methylpentene-1,3-methylbutene-1,1-hexene, 4-methylpentene-1,5-ethylhexene-1,1-octene, 1-decene, 1-dodecene, vinylcyclohexene, styrene, allylbenzene, cyclopentene, norbornene, and 5-methyl-2-norbornene.

From the viewpoint of the breakdown voltage and the heat resistance, the copolymerized amount of the component other than propylene is preferably less than 1 mol %, and the blended amount of the component other than propylene is preferably less than 1% by mass, with respect to the total amount of the resin constituting the film.

The polypropylene film may contain a branched-chain polypropylene, from the viewpoint of improving the breakdown voltage in a high temperature environment. When incorporating a branched chain polypropylene, the branched chain polypropylene is preferably contained in an amount of from 0.05 to 10% by mass, more preferably from 0.5 to 8% by mass, and still more preferably from 1 to 5% by mass, with respect to 100% by mass of the total mass of the polypropylene. By incorporating the branched-chain polypropylene, spherulites formed in the cooling process of a melt-extruded resin sheet can be controlled to a small size, and the occurrence of electrical insulation defects in the stretching process can be reduced to a low level. As a result, the overall breakdown voltage can be improved, when the film is formed into a capacitor.

The polypropylene resin to be used in the polypropylene film may contain any of various additives such as organic particles, inorganic particles, crystal nucleating agents, antioxidants, thermal stabilizers, chlorine scavengers, slip agents, antistatic agents, antiblocking agents, fillers, viscosity modifiers and stain inhibitors, as long as the desired effect is not impaired.

When incorporating an antioxidant, among these, the selection of the type and the amount to be added of the antioxidant is important from the viewpoint of long-term heat resistance. That is, the antioxidant is preferably a phenolic antioxidant with steric hindrance, and when incorporating a plurality of antioxidants, at least one of them is preferably a high molecular-weight antioxidant having a molecular weight of 500 or more. Specific examples thereof include various kinds, but it is preferred to use, for example, 2,6-di-t-butyl-p-cresol (BHT; molecular weight: 220.4), along with 1,3,5-trimethyl-2,4,6-tris(3,5-di-t-butyl-4-hydroxybenzyl)benzene (such as Irganox (registered trademark) 1330, molecular weight: 775.2; manufactured by BASF Japan Ltd.), or tetrakis[methylene-3(3,5-di-t-butyl-4-hydroxyphenyl)propionate]methane (such as Irganox (registered trademark) 1010, molecular weight: 1177.7; manufactured by BASF Japan Ltd.) or the like, in combination. The total content of these antioxidants is preferably 0.1 to 1.0% by mass, with respect to the total amount of the polypropylene. Too low a content of the antioxidants may result in a poor long-term heat resistance. Too high a content of the antioxidants may have an adverse effect on the resulting capacitor element, because of blocking at a high temperature due to bleed-out of these antioxidants. The total content of these antioxidants is more preferably 0.2 to 0.7% by mass, and particularly preferably 0.2 to 0.4% by mass, with respect to the total mass of the resin.

The polypropylene film preferably has a static friction coefficient ($\mu s$) upon layering the films, of 0.3 or more and 1.5 or less, from the viewpoint of ensuring the element processability, while improving the voltage-resistance characteristics. When the $\mu s$ is less than 0.3, the resulting film may have too high a slippage, possibly resulting in the occurrence of winding displacement during winding in film formation, or during the processing of the element. When the $\mu s$ is more than 1.5, the slippage of the film may be extremely decreased, possibly resulting in a poor handleability, a susceptibility to wrinkles, and/or a poor element processability. The lower limit of the $\mu s$ is more preferably 0.4 or more, and most preferably 0.5 or more. On the other hand, the upper limit of the $\mu s$ is more preferably 1.0 or less, and still more preferably 0.8 or less.

The polypropylene film preferably has a film thickness of 0.5 $\mu m$ or more and less than 10 $\mu m$ because such a film is suitable for a thin, heat-resistant film capacitor, which is required particularly in automotive applications (including hybrid car applications) and the like to be used in a high temperature environment. The film thickness of the polypropylene film is more preferably 0.6 $\mu m$ or more and 8 $\mu m$ or less, and still more preferably 0.8 $\mu m$ or more and 6 $\mu m$ or less. When used as the above described heat-resistant film capacitor, the film thickness is most preferably 0.8 $\mu m$ or more and 4 $\mu m$ or less, in view of the balance between the characteristics, and the capacitor size as a result of reducing the film thickness.

Preferably, the polypropylene film is a monolayer film, but may be a laminated film.

The polypropylene film is preferably used as a dielectric film for a capacitor, but the type of the capacitor is not limited. Specifically, from the viewpoint of the electrode configuration, the capacitor may be either a capacitor in which a metal foil and a film are layered and wound, or a metal-deposited film capacitor. The polypropylene film can be preferably used in an oil-impregnated capacitor impregnated with an insulating oil, or a dry capacitor in which no insulating oil is used. However, the polypropylene film is particularly preferably used as a metal-deposited film capacitor, because of its film characteristics. From the viewpoint of the shape, the capacitor may be a wound capacitor or a laminated capacitor.

Since a polypropylene film usually has a low surface energy, and it is difficult to stably perform a metal vapor deposition thereon, it is preferred to subject the polypropylene film to a surface treatment before performing the metal vapor deposition to improve adhesiveness between the polypropylene film and the resulting metal film. Specific examples of the surface treatment include a corona discharge treatment, a plasma treatment, a glow treatment and a flame treatment. While a polypropylene film usually has a surface wetting tension of about 30 mN/m, it is preferred to increase the wetting tension approximately to from 37 to 75 mN/m, more preferably from 39 to 65 mN/m, and most preferably from 41 to 55 mN/m by such a surface treatment because adhesion to the metal film and safety can be improved.

The polypropylene film can be obtained by using a raw material capable of imparting the above mentioned characteristics, and subjecting the film to biaxial stretching, a heat treatment and a relaxation treatment. The biaxial stretching can be carried out by any of inflation simultaneous biaxial stretching, tenter simultaneous biaxial stretching and tenter sequential biaxial stretching. Among these methods, tenter sequential biaxial stretching is preferably used from the viewpoint of controlling the film formation stability, crystal/amorphous structure, surface properties, mechanical properties and thermal dimensional stability of the film.

Next, a method of producing the polypropylene film will be described, with reference to examples. First, polypropylene resin is melt-extruded on a support to prepare an unstretched polypropylene film. The thus formed unstretched polypropylene film is sequentially biaxially stretched, by being stretched in the machine direction and then stretched in the transverse direction. Subsequently, the stretched film is subjected to a heat treatment and a relaxation treatment, to prepare a biaxially oriented polypropylene film. A more specific description will be given below, but this disclosure is not necessarily construed as being limited thereto.

First, to increase the absolute value of the storage modulus at a high temperature, to improve the temperature dependence of the storage modulus at a high temperature, the breakdown voltage and the thermal dimensional stability, and to reduce the leakage current of the film, a polypropylene resin having a CXS content of less than 1.5% by mass is melt-extruded from a single-screw extruder controlled to an extrusion temperature of 220 to 280° C., preferably 230 to 270° C., passed through a filtration filter, and then extruded from a slit-shaped die at a temperature of 200 to 260° C., more preferably 210 to 240° C. Since the temperature dependence of the storage modulus at a high temperature can be reduced by allowing the resin to melt sufficiently during the melt extrusion, and thereby preventing the cleavage of molecular chains due to shear by screw rotation, the resin is preferably maintained at a high temperature before being passed through the filtration filter, and at a low temperature after being passed through the filter. The molten sheet extruded from the slit-shaped die is allowed to solidify on a casting drum (cooling drum) controlled at a temperature of from 10 to 110° C., to obtain an unstretched polypropylene film. The molten sheet may be allowed to adhere to the casting drum using any of an electrostatic application method, an adhesion method using the surface tension of water, an air knife method, a press roll method, an underwater casting method, an air chamber method and the like. Among these, the air knife method is preferred which provides a good flatness and is capable of controlling the surface roughness. In the air knife method, it is preferred to adjust the position of the air knife, as appropriate so that air flows downstream in the film forming direction to prevent vibration of the film.

Subsequently, the unstretched polypropylene film is biaxially stretched so that the film is a biaxially orientated. The unstretched polypropylene film is heated by allowing the film to pass between rolls each of which is maintained at a temperature of 70 to 150° C., preferably 80 to 145° C. While continuing to maintain the unstretched polypropylene film at a temperature of 70° C. to 150° C., preferably 80 to 145° C., the film is stretched 2 to 15 times, preferably 4.5 to 12 times, and more preferably 5.5 to 10 times in the machine direction, followed by cooling to room temperature.

Thereafter, the film uniaxially stretched in the machine direction is led to a tenter while continuing to hold the ends of the film with clips. The fibril structure highly oriented in the machine direction by being uniaxially stretched can further be reinforced, and the storage moduli in the machine direction and the transverse direction of the film at a high temperature can be increased by setting the temperature in the preheating step immediately before stretching the film in the transverse direction to 5 to 15° C. higher, preferably 5 to 12° C. higher, and more preferably 5 to 10° C. higher than the stretching temperature in the transverse direction. Further, such a preheating temperature is preferred because molecular chains that are insufficiently oriented after uniaxial stretching can be stabilized by preheating at a high temperature to improve the thermal dimensional stability. When the preheating temperature is less than the stretching temperature plus 5° C., it may lead to a low storage modulus at a high temperature, a poor temperature dependence, and/or a failure to achieve an improvement in thermal dimensional stability. On the other hand, when the preheating temperature is higher than the stretching temperature plus 15° C., it may cause the rupture of the film in the stretching process.

The temperature at which the film is then stretched in the transverse direction (stretching temperature in the transverse direction) while continuing to hold the ends of the film with clips is 150 to 170° C., and preferably 155 to 165° C.

From the viewpoint of reducing the temperature dependence of the storage modulus at a high temperature, the stretching ratio in the transverse direction is 10.5 to 20 times, more preferably 11 to 19 times, and most preferably 11.5 to 18 times. When the stretching ratio in the transverse direction is less than 10.5 times, the orientation contribution of the fibril structure, which is highly oriented in the machine direction by the uniaxial stretching, remains largely. As a result, not only the storage modulus in the transverse direction cannot be increased, but also the storage modulus within the film surface is decreased, resulting in a film having a poor temperature dependence of the storage modulus at a high temperature. It is preferred to increase the stretching ratio in the transverse direction because the orientation in the transverse direction can be imparted while maintaining a highly oriented state in the machine direction, and thus leads to an increase in the tension of the molecular chains within the surface. When the stretching ratio in the transverse direction is more than 20 times, on the other hand, the film may be susceptible to rupture during film formation, possibly resulting in a poor productivity.

At this time, the area stretching ratio is preferably 60 times or more, from the viewpoint of improving the temperature dependence of the storage modulus at a high temperature, and improving the long-term operating reliability in a high temperature environment, when the film is formed into a capacitor. The "area stretching ratio" refers to a value obtained by multiplying the stretching ratio in the machine direction by the stretching ratio in the transverse direction. The area stretching ratio is preferably 62 times or more, more preferably 64 times or more, still more preferably 68 times or more, and most preferably 72 times or more.

In the subsequent heat treatment and relaxation treatment process, in the production of the polypropylene film, it is preferred to subject the film to a multi-stage heat treatment as follows. Specifically, in the multi-stage heat treatment, the film first is subjected to heat-setting (first stage heat treatment) at a temperature (first stage heat treatment temperature) of 145° C. or higher and 165° C. or lower, and of less than the stretching temperature in the transverse direction, while providing a relaxation of 2 to 20% in the transverse direction, with the tension in the transverse direction maintained by holding with clips. Subsequently, the film is subjected to a heat treatment (second stage heat treatment) again, at a temperature of 135° C. or higher and less than the above described heat-setting temperature (first stage heat treatment temperature), while maintaining the tension in the transverse direction by holding with clips. Further, the film is subjected to heat-setting (third heat treatment) at a temperature of 80° C. or higher and less than the above described heat-setting temperature (second stage heat treatment temperature), while maintaining the tension in the transverse direction by holding with clips. Such a multi-stage heat treatment is preferred because it enables increasing the absolute value of the storage modulus at a high temperature to improve the temperature dependence of the storage modulus at a high temperature and the thermal dimensional stability, and obtain voltage resistance and reliability when formed into a capacitor.

In the relaxation treatment, the relaxation rate is preferably 2 to 20%, more preferably 5 to 18%, and still more preferably 8 to 15%, from the viewpoint of increasing the thermal dimensional stability. When the relaxation rate is more than 20%, there are instances where the film may be excessively loosened within the tenter to cause wrinkles in the resulting product, possibly leading to the occurrence of unevenness during vapor deposition, or the mechanical properties may be decreased. When the relaxation rate is lower than 2%, on the other hand, a sufficient thermal dimensional stability cannot be obtained, possibly resulting in a decrease in capacitance or short-circuit destruction in a high temperature environment, when the film is formed into a capacitor.

After being subjected to the multi-stage heat treatment, the film is led outside the tenter, and released from the clips holding the ends of the film in a room temperature atmosphere. In the subsequent step of winding the film by a winder, film edges are slit off, and the film having a thickness of 0.5 μm or more and less than 10 μm is wound to obtain a film product roll. Before winding the film into a roll, the surface of the film to be vapor deposited is preferably subjected to a corona discharge treatment in air, nitrogen, carbon dioxide gas or a mixed gas thereof to improve the adhesion to the vapor-deposited metal.

Specific examples of the production conditions to be focused on to obtain the polypropylene film include the following:
The polypropylene resin has a CXS content of less than 1.5% by mass.
The area stretching ratio during stretching is 60 times or more.
The stretching ratio in the transverse direction is 10.5 times or more.
The preheating temperature before the stretching in the transverse direction is 5° C. to 15° C. higher than the stretching temperature in the transverse direction.
The first stage heat treatment temperature is a temperature of 145° C. or higher and 165° C. or lower, and of less than the stretching temperature in the transverse direction.
The second stage heat treatment temperature is 135° C. or higher and less than the first stage heat treatment temperature.
The third stage heat treatment temperature is 80° C. or higher and less than the second stage heat treatment temperature.
A relaxation treatment in the transverse direction of from 2 to 20% is carried out in the first stage heat treatment step.

Subsequently, a description will be given of a metal film-laminated film including the polypropylene film, a film capacitor including the same, and methods of producing the metal film-laminated film and the capacitor.

The metal film-laminated film includes: the polypropylene film; and a metal film provided on at least one surface of the film. This metal film-laminated film can be obtained by providing a metal film on at least one surface of the above described polypropylene film.

The method of providing a metal film is not particularly limited. For example, a method is preferably used in which aluminum or an alloy of aluminum and zinc is vapor deposited on at least one surface of the polypropylene film to form a metal film such as a vapor deposited film, which serves as an internal electrode of a film capacitor. In this method, any of other metal components such as nickel, copper, gold, silver and chromium can also be vapor-deposited simultaneously or sequentially with aluminum. Further, it is also possible to provide a protective layer on the vapor deposited film, with an oil or the like. When the top and bottom surfaces of the polypropylene film have different surface roughnesses, it is preferred to provide a metal film on the surface with a lower roughness, to prepare a metal film-laminated film, from the viewpoint of increasing the voltage resistance.

The metal film-laminated film can be subjected to an annealing treatment or a heat treatment at a specific temperature, if necessary, after the formation of the metal film. Further, it is also possible to provide a coating of a resin such as polyphenylene oxide on at least one surface of the metal film-laminated film for the purpose of insulation or any other purpose.

The film capacitor includes the metal film-laminated film.
For example, the film capacitor can be obtained by laminating or winding the above described metal film-laminated film(s) using any of various methods. A preferred example of the method of producing a wound film capacitor is as follows.

Aluminum is vapor deposited under reduced pressure on one surface of the polypropylene film. At this time, aluminum is vapor deposited in the form of stripes having margin portions extending in the machine direction of the film. Subsequently, the centers of the respective vapor deposited portions and the centers of the respective margin portions are slit with a blade to prepare tape-like take-up reels, each having a margin portion at one side of the surface. Two pieces of tape-like take-up reels, one having a margin portion on the left side and one having a margin portion on the right side, are laminated with each other such that each vapor deposited portion protrudes from each margin portion in the transverse direction, and wound to obtain a wound roll.

In performing vapor deposition on both surfaces of the film, aluminum is vapor deposited in the form of stripes having margin portions extending in the machine direction, on one surface, and on the other surface, aluminum is vapor deposited in the form of stripes such that margin portions extending in the machine direction are located at positions corresponding to the centers of the vapor deposited portions on the back surface side. Subsequently, the centers of the margin portions on the top and bottom surfaces are slit with a blade to prepare tape-like take-up reels, each having a margin at one side on each of both surfaces (for example, if there is a margin on the right side on the top surface, there is a margin on the left side on the bottom surface). One piece of the resulting reels and one piece of a non-vapor-deposited layering film are laminated with each other such that the metallized film protrudes from the layering film in the transverse direction, and wound to obtain a wound roll.

The core is removed from the thus prepared wound roll, and the resultant is subjected to pressing. Thereafter, metallikon (metal spraying) is performed at both ends of the pressed roll to prepare external electrodes, and lead wires are welded to the metallikon (sprayed metal) to obtain a wound film capacitor. Film capacitors can be used in a wide variety of applications such as railway vehicle applications, automotive applications (including hybrid cars and electric vehicles), solar power generation and wind power generation applications as well as general home appliance applications. The film capacitor can also be suitably used in any of these applications. In addition to the above, the film capacitor can also be used in various applications such as packaging films, release films, process films, hygiene products, agricultural supplies, construction materials and medical supplies.

Methods of measuring characteristic values and methods of evaluating effects are as follows.

(1) Film Thickness

The thickness of the polypropylene film was measured at 10 arbitrary locations in an atmosphere of 23° C. and 65% RH, using a contact-type electronic micrometer (Model K312 A) manufactured by Anritsu Corporation. The arithmetic mean value of the measured thicknesses at the 10 locations was defined as the film thickness of the polypropylene film.

(2) Temperature Dependence of the Sum of Storage Moduli in Machine Direction and Transverse Direction of Film at 125° C. and 135° C. (E'135 (MD+TD)/E'125 (MD+TD)), Storage Modulus in Transverse Direction of Film at 135° C., Loss Tangent at 23° C. (Tan δ23), and the Sum of Storage Moduli in Machine Direction and Transverse Direction of Film at 130° C. (E'130 (MD+TD))

Using the apparatus and conditions shown below, a rectangular sample of the polypropylene film (width (short side): 10 mm×length (long side) 50 mm) was cut out, taking the test length direction (the machine direction or the transverse direction) of the film as the long side direction. The sample was set to the chuck portion of the apparatus in an atmosphere of 23° C., and the measurement was carried out by increasing the temperature from 23° C. to 260° C. A viscoelasticity-temperature curve was drawn by the dynamic viscoelastic method, and the storage modulus at 125° C. (E'125), the storage modulus at 130° C. (E'130) and the storage modulus at 135° C. (E'135) were read. The number of measurement tests was set to n=3, and the mean value of the measured values was defined as the storage modulus in the measured direction. The measurement was carried out in each of the machine direction and the transverse direction of the film. The values of (E'135 (MD+TD)/E'125 (MD+TD)) and (E'130 (MD+TD)) were calculated from the thus obtained results. Further, the mean value of the storage modulus values obtained as the results of the above described measurements in the transverse direction of the film at 135° C., was defined as the storage modulus in the transverse direction of the film at 135° C.

Apparatus: EXSTAR DMS 6100 (manufactured by Seiko Instruments Inc.)
Test mode: tensile mode
Distance between chucks: 20 mm
Frequency: 1 Hz
Strain amplitude: 10.0 μm
Gain: 1.5
Force amplitude initial value: 400 mN
Temperature range: 23 to 260° C.
Rate of temperature rise: 2° C./min
Measurement atmosphere: nitrogen
Measurement thickness: The film thickness determined in the above (1) was used.

Further, the loss tangent at 23° C. (tan δ23) was determined by: drawing a viscoelasticity-temperature curve by the dynamic viscoelastic method; reading each of the storage modulus (E'23) and the loss modulus (E''23); and performing calculation in accordance with the following formula:

$$\tan \delta 23 = E''23/E'23.$$

(3) Heat Shrinkage Stress in Machine Direction of Film at 135° C., and Heat Shrinkage Stresses in Machine Direction and Transverse Direction of Film at 130° C.

The polypropylene film was cut into a rectangular sample having a width of 4 mm and a length of 50 mm, taking the machine direction of the film as the long side, and the sample of the film was sandwiched between the chucks made of metal such that the test length was 20 mm. The sample sandwiched between the chucks was set to the following apparatus, and a stress curve in the machine direction of the film whose test length was kept constant was obtained, by the following temperature program. From the thus obtained stress curve, the shrinkage stress of the film at 135° C. was read. The number of measurement tests was set to n=3, and the arithmetic mean value of the measured values was defined as the shrinkage stress. Further, the heat shrinkage stress at 130° C. was measured in the same manner, in each of the machine direction and the transverse direction of the film.

Apparatus: a thermomechanical analyzer, TMA/SS6000 (manufactured by Seiko Instruments Inc.)
Test mode: L control mode
Test length: 20 mm
Temperature range: 23 to 200° C.
Rate of temperature rise: 10° C./min
SS program: 0.1 μm/min
Measurement atmosphere: nitrogen
Measurement thickness: The film thickness determined in the above (1) was used.

(4) Heat Shrinkage after Heat Treatment at 125° C. for 15 Minutes and Heat Shrinkage after Heat Treatment at 135° C. for 10 Minutes The polypropylene film was cut into a rectangular sample having a length of 30 mm and a width of 10 mm and, taking the transverse direction of the film as the long side. Five pieces of such samples were prepared. On each sample, marks were made at positions 5 mm from the centers of the short sides toward the center of the film so that the test length was 20 mm ($l_0$). Subsequently, each test piece was wrapped in a paper and heated in an oven maintained at 125° C. without applying a load thereto. After heating for 15 minutes, the test piece was taken out of the oven and cooled to room temperature. The length ($l_1$) between the above described two marks were measured for each test piece, and the heat shrinkage was calculated in accordance with the following Formula:

$$\text{Heat shrinkage} = \{(l_0 - l_1)/l_0\} \times 100(\%).$$

The arithmetic mean value of the measured values for the five pieces of samples was defined as the heat shrinkage.

Further, the heat shrinkage after a heat treatment at 135° C. for 10 minutes was measured in the same manner.

(5) Rupture Strengths in Machine Direction and Transverse Direction of Film

The polypropylene film was cut into a rectangular shape (width (short side) 10 mm×length (long side) 150 mm), taking the test length direction (the machine direction or the transverse direction) of the film as the long side direction to be used as a measurement sample. Subsequently, the sample was set to a sample tensile tester (Tensilon UCT-100, manufactured by Orientec Co., Ltd.) at an initial distance between chucks of 20 mm, and the tensile test of the film was carried out at a tensile speed of 300 mm/min, in an environment of 23° C. and 65% RH. At this time, the position of the sample in the length direction thereof was adjusted such that the center of the sample was in the vicinity of the midpoint between the chucks. The load at which the film had ruptured was read and the value obtained by dividing the load by the cross-sectional area (film thickness×width (10 mm)) of the sample before the test, was defined as the rupture stress (each in unit MPa) of the film. The measurement was carried out five times, for each of the samples for measurements in the machine direction and the transverse direction, and the rupture strength in the machine direction or the transverse direction was determined as the arithmetic mean value of the measured values.

As the film thickness to be used for calculating the rupture stress, the value measured in the above (1) was used.

(6) Degree of Bias of Roughness Shape Ssk (Skewness) of Surface

The measurement was carried out using VertScan 2.0 R5300 GL-Lite-AC, manufactured by Ryoka Systems Inc. The undulation component was removed from a captured image by polynomial fourth-order approximation surface correction using the accompanying analysis software, and then interpolation processing (the processing of compensating for pixels whose height data could not be acquired, with height data calculated from the surrounding pixels) was carried out. Respective parameters were obtained based on ISO 25178. The measurement was carried out at five arbitrary locations on one surface and the arithmetic mean value of the measured values was determined. Although the measurement was carried out on both surfaces of the film, each value shown in the Table is that measured on the side of the surface having a lower Ssk value. The surface in contact with the casting drum usually has a lower value. The measurement conditions are as follows.

Manufacturer: Ryoka Systems Inc.
Name of apparatus: VertScan 2.0 R5300 GL-Lite-AC
Measurement conditions: CCD camera SONY HR-57, ½ inch (1.27 cm)
   Objective lens: 10×
   Intermediate lens: 0.5×
   Wavelength filter: 520 nm, white
Measurement mode: phase
Measurement software: VS-Measure Version 5.5.1
Analysis software: VS-Viewer Version 5.5.1
Measurement area: 1.252×0.939 $mm^2$.

(7) Total Volume of Valleys Having Depth of 20 nm or More, on Film Surface

The measurement was carried out in the same manner as in the above (6), and the bearing function, which is an analysis tool of the accompanying software, was used to perform an analysis. To specify the voids of valleys having a depth of 20 nm or more, the valley height threshold value was set to −20 nm, in the height region specification. Subsequently, the value of the analyzed valley void volume was read, and rounded off to two digits of significant figures. Although the measurement was carried out on both surfaces of the film, each value shown in the Table is that measured on the side of the surface on which the Ssk value in the above (6) was determined.

(8) Arithmetic Mean Height (Sa) and Maximum Height (Sz)

The measurement was carried out in the same manner as in the above (6). The undulation component was removed from a captured image by polynomial fourth-order approximation surface correction using the accompanying analysis software, and then interpolation processing (the processing of compensating for pixels whose height data could not be acquired, with height data calculated from the surrounding pixels) was carried out. Respective parameters were obtained based on ISO 25178. The measurement was carried out at five arbitrary locations on one surface and the arithmetic mean value of the measured values was determined. Although the measurement was carried out on both surfaces of the film, each value shown in the Table is that measured on the side of the surface on which the Ssk value in the above (6) was determined.

(9) Film Breakdown Voltage at 130° C. (V/μm)

After heating the film in an oven maintained at 130° C. for one minute, the breakdown voltage was measured in the same atmosphere in accordance with the method B (flat plate electrode method) defined in JIS C2330 (2001) 7.4.11.2. However, an electrode obtained by placing on a metal plate described in the method B in JIS C2330(2001)7.4.11.2, a "Conductive Rubber E-100<65>" manufactured by Togawa Rubber Co., Ltd. and having the same size as the metal plate, was used as the lower electrode. The breakdown voltage test was carried out 30 times and each measured value was divided by the thickness of the film (measured in the above (1)), and converted to (V/μm). Of the 30 measured values (calculated values) in total, top five values counted from the maximum value and bottom five values counted from the minimum value were excluded, and the mean value of the remaining 20 values was defined as the film breakdown voltage at 130° C.

(10) Cold Xylene Soluble Component (CXS)

A quantity of 0.5 g of a polypropylene resin when measuring the raw material, or 0.5 g of a film sample when measuring the film was dissolved in 100 ml of xylene at 135° C. and allowed to cool. Thereafter, the resulting solution was allowed to recrystallize in a constant-temperature water bath controlled at 20° C. for one hour, and then the polypropylene component dissolved in the filtrate was quantified by liquid chromatography. The amount of the polypropylene component dissolved in the filtrate was defined as X (g), the precise value of 0.5 g of the sample was defined as X0 (g), and the amount of CXS was calculated in accordance with the following Formula:

$$CXS (\%)=(X/X0)\times 100.$$

(11) Meso Pentad Fraction

A polypropylene resin when measuring the raw material, or a film sample when measuring the film, was formed into a powder by freezing and crushing. The resulting powder was extracted with n-heptane at 60° C. for two hours to remove impurities and additives in the polypropylene, and then dried under reduced pressure at 130° C. for two or more hours, to obtain a sample. The thus obtained sample was dissolved in a solvent, and the meso pentad fraction (mmmm) was determined by $^{13}$C-NMR under the following conditions (unit: %).

Measurement Conditions
Apparatus: DRX-500, manufactured by Bruker Corporation
Measurement nucleus: $^{13}$C nucleus (resonance frequency: 125.8 MHz)
Measurement concentration: 10% by mass
Solvent: a 1:3 (volume ratio) mixed solution of benzene and deuterated o-dichlorobenzene
Measurement temperature: 130° C.
Spin rotation frequency: 12 Hz
NMR sample tube: 5 mm tube
Pulse width: 45° (4.5 μs)
Pulse repetition time: 10 seconds
Data point: 64 K
Cumulative number: 10,000 times Measurement mode: complete decoupling
Analysis Conditions Fourier transformation was carried out with an LB (line broadening factor) of 1, and the mmmm peak was set to 21.86 ppm. WINFIT software (manufactured by Bruker Corporation) is used to split peaks. At this time, the peak splitting is carried out from the peak on the high-magnetic field side as follows. Further, automatic fitting by the software is performed to optimize the peak splitting, and the total of peak fractions of mmmm is defined as the meso pentad fraction (mmmm).
(1) mrrm
(2) (3) rrrm (split into two peaks)
(4) rrrr
(5) mrmr
(6) mrmm+rmrr
(7) mmrr
(8) rmmr
(9) mmmr
(10) mmmm The same measurement was carried out five times on the same sample and the mean value of the thus obtained meso pentad fractions was defined as the meso pentad fraction of the sample.
(12) Melting Point of Polypropylene Resin Using a differential scanning calorimeter (EXSTAR DSC 6220, manufactured by SEIKO instruments Inc.), 3 mg of polypropylene chips are heated from 30° C. to 260° C. at a rate of 20° C./min in a nitrogen atmosphere. Subsequently, the temperature is maintained at 260° C. for 5 minutes and then lowered to 30° C. at a rate of 20° C./min. Further, the temperature is maintained at 30° C. for 5 minutes and then increased from 30° C. to 260° C. at a rate of 20° C./min. The peak temperature in the endothermic curve obtained during the temperature increase was defined as the melting point of the polypropylene resin. When a plurality of peak temperatures can be observed, the highest peak temperature was defined as the melting point of the polypropylene resin.
(13) Static Friction Coefficient (μs)

The static friction coefficient was measured at 25° C. and 65% RH in accordance with JIS K 7125 (1999), using a slip tester manufactured by Toyo Seiki Co., Ltd. The measurement was carried out by layering films in the machine direction such that different surfaces of the films are in contact. The same measurement was carried out five times per sample, and the mean value of the resulting measured values was calculated, to be defined as the static friction coefficient (μs) of the sample.
(14) Evaluation of Film Capacitor Characteristics (Element Processability, Voltage Resistance and Reliability at 120° C.)

Using a vacuum vapor deposition apparatus manufactured by ULVAC, Inc., aluminum was vapor deposited on one surface of the film (on the surface having a higher wetting tension, when the wetting tension varies between the top and bottom surfaces), in a so-called T-margin deposition pattern (adjusted to a pitch (period) in the machine direction of 17 mm, and a fuse width of 0.5 mm, by a masking oil), in which margin portions are provided in the direction perpendicular to the machine direction, at a film resistance of 10 Ω/sq. Then, the film was slitted to obtain a vapor-deposited reel having a film width of 50 mm (edge margin width: 2 mm).

Subsequently, a capacitor element was wound by an element winding machine (KAW-4NHB) manufactured by Kaido Manufacturing Co., Ltd., using the thus obtained reel. After performing metallikon (metal spraying), the resultant was subjected to a heat treatment at a temperature of 130° C. for 8 hours under reduced pressure and lead wires were attached to complete the capacitor element.

Using 10 pieces of the thus obtained capacitor elements, a so-called step-up test was performed. In the step-up test, an operation of applying a voltage of 250 VDC to each capacitor element at 120° C., maintaining the voltage for 10 minutes, and then gradually increasing the applied voltage stepwise at a rate of 50 VDC/min, was repeated.
Evaluation of Element Processability The prepared capacitor element was evaluated by visual observation in accordance with the following criteria:
    A: No deformation or wrinkling of the capacitor element is observed.
    B: Slight deformation and/or wrinkling of the capacitor element are/is observed.
    C: Noticeable deformation and/or wrinkling of the capacitor element are/is observed.
Those evaluated as A and B are usable, and A indicates a higher performance. Those evaluated as C are difficult to be used practically.
Evaluation of Reliability After increasing the voltage until the electrostatic capacitance is decreased by 12% or less relative to the initial value, the capacitor element is disassembled to examine the state of destruction, and the reliability of the capacitor was evaluated in accordance with the following criteria:
    A: There is no change in the shape of the element, and no penetrating destruction is observed.
    B: There is no change in the shape of the element, but a penetrating destruction of within 10 film layers is observed.
    C: A change in the shape of the element or a penetrating destruction of more than 10 film layers is observed.
    D: The shape of the element is greatly changed to cause the destruction of the element.
Those evaluated as A can be used without any problems, and those evaluated as B can be used depending on the conditions. Those evaluated as C are inferior in practical performance, and those evaluated as D are more inferior in practical performance.
Evaluation of Voltage Resistance The change in the electrostatic capacitance in the step-up test was measured and plotted on a graph. The voltage at which the capacitance had reached 70% of the initial value was divided by the film thickness (determined in the above (1)), and the resulting value was used to evaluate the voltage resistance, in accordance with the following criteria:
    A: 400 V/μm or more
    B: 390 V/μm or more and less than 400 V/μm
    C: 380 V/μm or more and less than 390 V/μm
    D: less than 380 V/μm
Those evaluated as A and B are usable, and A indicates a higher performance. Those evaluated as C are inferior in practical performance, and those evaluated as D are more inferior in practical performance.

EXAMPLES

Our films and capacitors will now be described further specifically, with reference to Examples.

Example 1

A polypropylene resin manufactured by Prime Polymer Co., Ltd. and having a meso pentad fraction of 0.983, a melting point of 168° C., a melt flow rate (MFR) of 2.6 g/10 min and a cold xylene soluble component (CXS) content of 0.8% by mass, was supplied to an extruder controlled at a temperature of 255° C., and allowed to melt. The molten resin was melt-extruded in the form of a sheet, through a T-shaped slit die which had been set so that the resin temperature after being passed through a filtration filter was 220° C. The thus extruded molten sheet was allowed to adhere to a casting drum maintained at 98° C., with an air knife, and cooled and solidified to obtain an unstretched polypropylene film. The unstretched polypropylene film was preheated to 141° C. in stages, by a plurality of rolls, and then passed between rolls varying in peripheral speed, in that state, to be stretched 6.2 times in the machine direction. Subsequently, the film was led to a tenter, and preheated at a temperature of 168° C. (the TD stretching temperature+7° C.), while continuing to hold both ends of the film in the transverse direction with clips. Thereafter, the film was stretched 12.5 times in the transverse direction at a temperature of 161° C. The film was then subjected to a heat treatment at 157° C. while relaxing 10% in the transverse direction, as the first stage heat treatment and the relaxation treatment, and further subjected to a heat treatment at 142° C. while continuing to hold both ends of the film in the transverse direction with clips, as the second stage heat treatment. Finally, the film was subjected to a heat treatment at 111° C. as the third stage heat treatment, then led outside the tenter, and released from the clips holding the ends of the film. Subsequently, a corona discharge treatment was performed on the film surface (on the side in contact with the casting drum) at a treatment intensity of 25 W·min/m$^2$ in air, and a film having a film thickness of 2.3 μm was wound into a film roll. The characteristics of the polypropylene film and the characteristics of the capacitor of Example 1 are as shown in Table 1. The film of Example 1 showed an extremely good temperature dependence of the storage modulus. As a capacitor, an excellent element processability, voltage resistance evaluation and reliability were obtained.

Examples 2 to 6

The same procedure as in Example 1 was repeated, except that the temperature of the casting drum for cooling the melt-extruded sheet, the stretching ratio in biaxial stretching as well as TD preheating, TD stretching and heat treatment conditions were changed as shown in Table 1, to obtain: a polypropylene film having a thickness of 2.3 μm in Example 2; a polypropylene film having a thickness of 2.4 μm in Example 3; a polypropylene film having a thickness of 2.4 μm in Example 4; a polypropylene film having a thickness of 2.3 μm in Example 5; and a polypropylene film having a thickness of 6.0 μm in Example 6.

The characteristics of the polypropylene films and the characteristics of the capacitors of the respective Examples are as shown in Table 1. The polypropylene film of Example 2 showed a good temperature dependence of the storage modulus. As a capacitor, although wrinkles occurred slightly during the processing thereof, an excellent voltage resistance was obtained, and the reliability was at a level that allows for practical use without problems. The polypropylene film of Example 3 showed an extremely good temperature dependence of the storage modulus and, as a capacitor, an excellent element processability, voltage resistance evaluation and reliability were obtained. The polypropylene film of Example 4 showed a good temperature dependence of the storage modulus. As a capacitor, although wrinkles occurred slightly during the processing thereof, the evaluation of the voltage resistance was high, and the reliability was at a level that allows for practical use without problems. The polypropylene film of Example 5 showed a good temperature dependence of the storage modulus. As a capacitor, although wrinkles occurred slightly during the processing thereof, the evaluation of the voltage resistance was high, and the reliability was at a level that allows for practical use without problems. The polypropylene film of Example 6 showed a good temperature dependence of the storage modulus. As a capacitor, an excellent processability and a high voltage resistance evaluation were obtained, and the reliability was at a level that allows for practical use without problems.

Example 7

A polypropylene resin manufactured by Prime Polymer Co., Ltd., and having a meso pentad fraction of 0.975, a melting point of 166° C., a melt flow rate (MFR) of 3.0 g/10 min and a cold xylene soluble component (CXS) content of 1.7% by mass, was supplied to an extruder controlled at a temperature of 260° C., and allowed to melt. The molten resin was melt-extruded in the form of a sheet, through a T-shaped slit die which had been set so that the resin temperature after being passed through a filtration filter was 260° C. The same procedure as in Example 1 was repeated, except that the temperature of the casting drum for cooling the melt-extruded sheet, the stretching ratio in biaxial stretching, as well as TD preheating, TD stretching and heat treatment conditions were changed as shown in Table 1 to obtain a polypropylene film having a thickness of 2.3 μm in Example 7. The polypropylene film of Example 7 showed a good temperature dependence of the storage modulus. As a capacitor, an excellent processability and a high voltage resistance evaluation were obtained, and the reliability was at a level that allows for practical use without problems.

Comparative Example 1

A polypropylene resin manufactured by Prime Polymer Co., Ltd., and having a meso pentad fraction of 0.985, a melting point of 168° C., a melt flow rate (MFR) of 2.6 g/10 min and a cold xylene soluble component (CXS) content of 1.6% by mass, was supplied to an extruder controlled at a temperature of 260° C. and allowed to melt. The molten resin was melt-extruded in the form of a sheet, through a T-shaped slit die which had been set so that the resin temperature after being passed through a filtration filter was 260° C. The same procedure as in Example 1 was repeated, except that the temperature of the casting drum for cooling the melt-extruded sheet, the stretching ratio in biaxial stretching as well as TD preheating, TD stretching and heat treatment conditions were changed as shown in Table 1, to obtain a polypropylene film having a thickness of 2.4 μm in Comparative Example 1. The characteristics of the polypropylene film and the characteristics of the capacitor of Comparative Example 1 are as shown in Table 1.

In the polypropylene film of Comparative Example, the temperature dependence of the storage modulus was insufficient, because the TD preheating temperature and the TD stretching temperature were the same. Further, there were instances where wrinkles occurred during the transportation process of the roll, and where the presence of wrinkles was observed in the resulting capacitor element. The reason for this is assumed to be that the removal of the strain during stretching was insufficient because the TD preheating temperature and the TD stretching temperature were the same, and because the first stage heat treatment temperature after the transverse stretching was low. Further, the film breakdown voltage at 130° C. was also low and the reliability of the resulting capacitor was at a level that could cause problems in practical use since changes in the shape of the element were observed.

Comparative Examples 2 and 3

The same procedure as in Example 1 was repeated, except that the temperature of the casting drum for cooling the melt-extruded sheet, the stretching ratio in biaxial stretching as well as TD preheating, TD stretching and heat treatment conditions were changed as shown in Table 1, to obtain a polypropylene film having a thickness of 2.3 µm in Comparative Example 2, and a polypropylene film having a thickness of 2.3 µm in Comparative Example 3. The characteristics of the polypropylene films and the characteristics of the capacitors of the respective Comparative Examples are as shown in Table 1. The polypropylene film of Comparative Example 2 showed an insufficient temperature dependence of the storage modulus and a low film breakdown voltage at 130° C. because the area stretching ratio was low, the TD preheating temperature and the TD stretching temperature were the same, and no heat treatment was performed. Further, since the shape of the element was greatly changed to cause the destruction of the element, and the voltage resistance was evaluated as insufficient as well, the reliability of the resulting capacitor was at a level practically unusable. The polypropylene film of Comparative Example 3 showed an insufficient temperature dependence of the storage modulus and a low film breakdown voltage at 130° C. because the stretching ratio in the transverse direction was low. Further, since changes in the shape of the element were observed, and the voltage resistance was evaluated as somewhat insufficient as well, the reliability of the resulting capacitor was at a level that could cause problems in practical use.

Comparative Example 4

The same procedure as in Example 1 was repeated, except that a polypropylene resin manufactured by Prime Polymer Co., Ltd., and having a meso pentad fraction of 0.968, a melting point of 164° C., a melt flow rate (MFR) of 3.2 g/10 min and a cold xylene soluble component (CXS) content of 1.9% by mass was used, and that the temperature of the casting drum for cooling the melt-extruded sheet, the stretching ratio in biaxial stretching as well as TD preheating, TD stretching and heat treatment conditions were changed as shown in Table 1, to obtain a polypropylene film having a thickness of 2.4 µm.

The characteristics of the polypropylene film and the characteristics of the capacitor of the polypropylene film of Comparative Example 4 are as shown in Table 1. The polypropylene film showed an insufficient temperature dependence of the storage modulus and a low film breakdown voltage at 130° C. because the polypropylene raw material had a low stereoregularity and a high CXS content. Further, since the shape of the element was greatly changed to cause the destruction of the element, and the voltage resistance was evaluated as insufficient as well, the reliability of the resulting capacitor was at a level practically unusable.

Comparative Example 5

The polypropylene film of Comparative Example 5 is a polypropylene film produced by the method described in Example 1 in Patent Literature 1 (WO2015/146894). The characteristics of the polypropylene film and the characteristics of the capacitor of Comparative Example 5 are as shown in Table 1. There were instances where wrinkles occurred during the transportation process of the roll, and where the presence of wrinkles was observed in the resulting capacitor element. This is due to an insufficient removal of the strain during stretching because the TD preheating temperature and the TD stretching temperature were the same, and because the first stage heat treatment temperature after the transverse stretching was low. Further, the film breakdown voltage at 130° C. was also low, and the reliability of the capacitor was at a level to result in a poor performance in practical use since the shape of the element was greatly changed to cause the destruction of the element.

Comparative Example 6

The same procedure as in Example 1 was repeated, except that the temperature of the casting drum for cooling the melt-extruded sheet, the stretching ratio in biaxial stretching as well as TD preheating, TD stretching and heat treatment conditions were changed as shown in Table 1, and that the film was preheated to 140° C. after biaxial stretching, and longitudinally re-stretched 1.2 times, to obtain a polypropylene film having a thickness of 2.3 µm. The characteristics of the polypropylene film and the characteristics of the capacitor of the Comparative Example 6 are as shown in Table 1. Since the stretching ratio in the transverse direction was low, the film showed an insufficient storage modulus and a low film breakdown voltage at 130° C. Further, the element was wound tightly due to heat shrinkage in the MD direction in a high temperature environment to cause the occurrence of a short-circuit destruction, and the shape of the element was greatly changed to cause the destruction of the element, resulting in a poor reliability of the capacitor. The reason for this is assumed to be the strain remaining in the MD direction. On the other hand, the processability was at a level without problems, but there were instances where film rupture occurred during the longitudinal re-stretching.

Comparative Example 7

The same procedure as in Example 1 was repeated, to obtain a melt-extruded sheet. The thus obtained sheet was subjected to a heat treatment in an oven at 140° C. for 3 minutes, to obtain an unstretched film having a thickness of 200 µm. The characteristics of the polypropylene film and the characteristics of the capacitor of the Comparative Example 7 are as shown in Table 1. Since no biaxial stretching was performed, the film showed an insufficient temperature dependence of the storage modulus and a low film breakdown voltage at 130° C. Further, the breakdown voltage was outside the permissible measurement range since the film is thick, and it was unable to perform processing into a capacitor.

TABLE 1

| | | Example 1 | Example 2 | Example 3 | Example 4 | Example 5 | Example 6 | Example 7 |
|---|---|---|---|---|---|---|---|---|
| Casting drum temperature | (° C.) | 98 | 97 | 98 | 98 | 98 | 110 | 98 |
| Stretching ratio in the machine direction | (times) | 6.2 | 6.0 | 6.0 | 5.9 | 4.5 | 6.0 | 5.8 |
| Stretching ratio in the transverse direction | (times) | 12.5 | 10.5 | 11.8 | 11.5 | 13.5 | 12.4 | 11.8 |
| Area stretching Ratio | (times) | 78 | 63 | 71 | 68 | 61 | 74 | 68 |
| TD preheating temperature | (° C.) | 168 | 167 | 170 | 168 | 180 | 180 | 168 |
| TD stretching temperature | (° C.) | 161 | 160 | 159 | 161 | 168 | 164 | 161 |
| First stage heat treatment temperature | (° C.) | 157 | 156 | 155 | 155 | 158 | 155 | 150 |
| Second stage heat treatment temperature | (° C.) | 142 | 142 | 141 | 133 | 145 | 142 | 135 |
| Third stage heat treatment temperature | (° C.) | 111 | 110 | 112 | 90 | 100 | 105 | 90 |
| E'135 (MD + TD)/ E'125 (MD + TD) | (—) | 0.80 | 0.72 | 0.74 | 0.77 | 0.71 | 0.77 | 0.71 |
| Storage modulus in transverse direction of the film at 135° C. | (GPa) | 1.2 | 0.7 | 1.0 | 0.8 | 0.9 | 1.1 | 0.7 |
| E'130 (MD + TD) | (GPa) | 2.2 | 1.7 | 2.1 | 2.0 | 1.9 | 2.0 | 1.5 |
| Loss tangent in the transverse direction of the film at 23° C. (tan δ 23) | (—) | 0.047 | 0.052 | 0.049 | 0.054 | 0.061 | 0.058 | 0.055 |
| Heat shrinkage stress value in the machine direction of the film at 135° C. | (MPa) | 1.1 | 1.8 | 1.3 | 2.1 | 0.7 | 1.2 | 2.1 |
| Heat shrinkage stress value in the machine direction of the film at 130° C. | (MPa) | 1.0 | 1.7 | 1.2 | 2.0 | 0.5 | 1.1 | 2.1 |
| Heat shrinkage stress value in the transverse direction of the film at 130° C. | (MPa) | 1.1 | 1.8 | 1.2 | 2.0 | 1.9 | 1.2 | 2.2 |
| Cold xylene soluble component (CXS) content in film | (% by mass) | 0.8 | 0.8 | 0.8 | 0.8 | 0.8 | 0.8 | 1.7 |
| Heat shrinkage in transverse direction of film after heat treatment at 125° C. for 15 minutes | (%) | 0.0 | −0.1 | 0.0 | 0.0 | 0.7 | 0.0 | 0.5 |

TABLE 1-continued

| | | | | | | | | |
|---|---|---|---|---|---|---|---|---|
| Heat shrinkage in transverse direction of film after heat treatment at 135° C. for 10 minutes | (%) | 0.2 | -0.2 | 0.1 | 1.1 | 1.2 | 0.2 | 0.7 |
| Degree of bias of the roughness shape of surface, Ssk | (-) | 6.2 | 3.2 | 5.1 | 4.7 | -10.8 | 3.2 | 6.1 |
| Total volume of valleys having a depth of 20 nm or more, on film surface | ($\mu m^3$) | 674 | 754 | 691 | 721 | 4310 | 12812 | 681 |
| Arithmetic mean height, Sa | (nm) | 43.2 | 39.4 | 48.1 | 35.8 | 45.8 | 60.4 | 50.1 |
| Maximum height, Sz | (nm) | 454 | 364 | 486 | 331 | 1018 | 1358 | 551 |
| Film breakdown voltage at 130° C. | (V/$\mu$m) | 462 | 405 | 415 | 445 | 412 | 401 | 415 |
| Film thickness | ($\mu$m) | 2.3 | 2.3 | 2.4 | 2.4 | 2.3 | 6.0 | 2.3 |
| Static friction coefficient, $\mu s$ | (-) | 0.6 | 0.7 | 0.6 | 0.7 | 0.5 | 0.6 | 0.6 |
| Film capacitor characteristics | (Process-ability) | A | B | A | B | B | A | A |
| | (Voltage resistance) | A | A | A | B | B | B | B |
| | (Reliability) | A | B | A | B | B | B | B |

| | | Comparative Example 1 | Comparative Example 2 | Comparative Example 3 | Comparative Example 4 | Comparative Example 5 | Comparative Example 6 | Comparative Example 7 |
|---|---|---|---|---|---|---|---|---|
| Casting drum temperature | (° C.) | 91 | 94 | 98 | 98 | 90 | 99 | 20 |
| Stretching ratio in the machine direction | (times) | 6.0 | 4.6 | 6.8 | 6.2 | 5.7 | 5.6/1.2 | — |
| Stretching ratio in the transverse direction | (times) | 12.0 | 10.6 | 9.2 | 12.0 | 10.0 | 10.0 | — |
| Area stretching Ratio | (times) | 72 | 49 | 63 | 74 | 57 | 67 | — |
| TD preheating temperature | (° C.) | 161 | 165 | 168 | 168 | 160 | 180 | — |
| TD stretching temperature | (° C.) | 161 | 165 | 162 | 161 | 160 | 165 | — |
| First stage heat treatment temperature | (° C.) | 130 | — | 156 | 155 | 130 | 151 | 140 |
| Second stage heat treatment temperature | (° C.) | 140 | — | 141 | 140 | 140 | 148 | — |
| Third stage heat treatment temperature | (° C.) | 100 | — | 110 | 110 | 100 | 110 | — |
| E'135 (MD + TD)/ E'125 (MD + TD) | (-) | 0.68 | 0.59 | 0.65 | 0.61 | 0.67 | 0.69 | 0.51 |
| Storage modulus in transverse direction of the film at 135° C. | (GPa) | 0.7 | 0.6 | 0.6 | 0.8 | 1.2 | 1.1 | 0.4 |

TABLE 1-continued

| | | | | | | | | |
|---|---|---|---|---|---|---|---|---|
| E'130 (MD + TD) | (GPa) | 1.7 | 1.5 | 1.6 | 1.9 | 1.5 | 1.5 | 0.9 |
| Loss tangent in the transverse direction of the film at 23° C. (tan δ 23) | (-) | 0.062 | 0.078 | 0.068 | 0.074 | 0.062 | 0.061 | 0.082 |
| Heat shrinkage stress value in the machine direction of the film at 135° C. | (MPa) | 1.9 | 2.6 | 2.1 | 2.3 | 1.6 | 2.5 | 0.7 |
| Heat shrinkage stress value in the machine direction of the film at 130° C. | (MPa) | 1.8 | 2.5 | 2.0 | 2.2 | 1.5 | 2.5 | 0.6 |
| Heat shrinkage stress value in the transverse direction of the film at 130° C. | (MPa) | 2.2 | 2.6 | 2.1 | 2.3 | 2.1 | 0.8 | 0.5 |
| Cold xylene soluble component (CXS) content in film | (% by mass) | 1.6 | 0.8 | 0.8 | 1.9 | 1.9 | 0.8 | 0.8 |
| Heat shrinkage in transverse direction of film after heat treatment at 125° C. for 15 minutes | (%) | 0.7 | 2.0 | 0.0 | 0.3 | 0.6 | 1.8 | 0.2 |
| Heat shrinkage in transverse direction of film after heat treatment at 135° C. for 10 minutes | (%) | 0.9 | 2.2 | 0.1 | 0.5 | 0.8 | 0.4 | 0.1 |
| Degree of bias of the roughness shape of surface, Ssk | (-) | 2.1 | −14.2 | 1.8 | −11.3 | 1.1 | −21.4 | 1.1 |
| Total volume of valleys having a depth of 20 nm or more, on film surface | ($\mu m^3$) | 851 | 5320 | 2260 | 4521 | 1346 | 12132 | 250 |
| Arithmetic mean height, Sa | (nm) | 11.7 | 44.5 | 33.3 | 25.6 | 12.5 | 61.2 | 65.2 |
| Maximum height, Sz | (nm) | 312 | 435 | 402 | 531 | 197 | 1230 | 886 |
| Film breakdown voltage at 130° C. | (V/μm) | 395 | 341 | 382 | 351 | 397 | 380 | — |
| Film thickness | (μm) | 2.4 | 2.3 | 2.3 | 2.4 | 2.3 | 2.3 | 200 |
| Static friction coefficient, μs | (-) | 0.9 | 0.8 | 0.8 | 0.8 | 1.1 | 0.5 | 0.8 |
| Film capacitor characteristics | (Process-ability) | C | B | B | B | C | B | — |
| | (Voltage resistance) | B | D | C | D | C | D | — |
| | (Reliability) | C | D | C | D | D | D | — |

The invention claimed is:

1. A polypropylene film, wherein a relationship between a sum (E'135 (MD+TD)) of a storage modulus in a machine direction and a transverse direction of said polypropylene film, as determined by solid viscoelasticity measurement at 135° C., and a sum (E'125 (MD+TD)) of said storage modulus, as determined by solid viscoelasticity measurement at 125° C., satisfies formula (1):

$$E'135(MD+TD)/E'125(MD+TD) > 0.7 \quad (1).$$

2. The polypropylene film according to claim 1, wherein the storage modulus in the transverse direction of said polypropylene film, as determined by solid viscoelasticity measurement at 135° C., is 0.8 GPa or more.

3. The polypropylene film according to claim 1, wherein a heat shrinkage stress value in the machine direction of said polypropylene film, as determined using a thermomechanical analyzer at 135° C., is 2.0 MPa or less.

4. The polypropylene film according to claim 1, wherein heat shrinkage in the transverse direction of said polypropylene film, as determined by subjecting said polypropylene film to a heat treatment at 135° C. for 10 minutes, is 1% or less.

5. The polypropylene film according to claim 1, wherein, when said polypropylene film is completely dissolved in xylene and then allowed to precipitate at room temperature, an amount of polypropylene component dissolved in xylene (cold xylene soluble component: CXS) is less than 1.5% by mass.

6. The polypropylene film according to claim 1, wherein the sum (E'130 (MD+TD)) of the storage moduli in the machine direction and the transverse direction of said polypropylene film, as determined by solid viscoelasticity measurement at 130° C., is 1.6 GPa or more.

7. The polypropylene film according to claim 1, wherein a heat shrinkage stress value in the machine direction of said polypropylene film at 130° C. is 2.0 MPa or less.

8. The polypropylene film according to claim 1, wherein a heat shrinkage stress value in the transverse direction of said polypropylene film at 130° C. is 2.0 MPa or less.

9. The polypropylene film according to claim 1, wherein heat shrinkage in the transverse direction of said polypropylene film, as determined by subjecting said polypropylene film to a heat treatment at 125° C. for 15 minutes, is 0.6% or less.

10. The polypropylene film according to claim 1, wherein the loss tangent (tan δ 23) in the transverse direction of said polypropylene film, as determined by solid viscoelasticity measurement at 23° C., is 0.06 or less.

11. The polypropylene film according to claim 1, wherein the degree of bias of a roughness shape (Ssk) on at least one surface of said polypropylene film is more than −10 and less than 100.

12. The polypropylene film according to claim 1, wherein a total volume of valleys having a depth of 20 nm or more in a region of 1,252 μm×939 μm, on at least one surface of said polypropylene film, is 1 to 12,000 μm$^3$.

13. The polypropylene film according to claim 1, wherein an arithmetic mean roughness Sa on at least one surface of said polypropylene film is 10 to 60 nm, and a maximum height Sz on at least one surface thereof is 100 to 1,000 nm.

14. A metal film-laminated film comprising:
 the polypropylene film according to claim 1; and
 a metal film provided on at least one surface of said polypropylene film.

15. A film capacitor comprising the metal film-laminated film according to claim 14.

* * * * *